(12) United States Patent
Furukawa et al.

(10) Patent No.: US 7,329,613 B2
(45) Date of Patent: Feb. 12, 2008

(54) STRUCTURE AND METHOD FOR FORMING SEMICONDUCTOR WIRING LEVELS USING ATOMIC LAYER DEPOSITION

(75) Inventors: Toshiharu Furukawa, Essex Junction, VT (US); Steven J. Holmes, Guilderland, NY (US); David V. Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 392 days.

(21) Appl. No.: 10/906,899

(22) Filed: Mar. 11, 2005

(65) Prior Publication Data

US 2006/0205226 A1    Sep. 14, 2006

(51) Int. Cl.
*H01L 21/31* (2006.01)
*H01L 21/469* (2006.01)

(52) U.S. Cl. .............................. 438/763; 257/E21.033; 438/739

(58) Field of Classification Search ................ 438/763, 438/739, 694, 696; 977/890; 257/E21.033
See application file for complete search history.

(56) References Cited

U.S. PATENT DOCUMENTS

| | | | |
|---|---|---|---|
| 6,380,075 B1 | 4/2002 | Cabral, Jr. et al. | 438/637 |
| 6,403,382 B1 | 6/2002 | Zhu et al. | 436/176 |
| 7,005,391 B2* | 2/2006 | Min et al. | 438/778 |
| 2002/0045343 A1 | 4/2002 | McElwee-White et al. | |
| 2004/0229457 A1 | 11/2004 | Chan et al. | |
| 2005/0266267 A1* | 12/2005 | Weiner et al. | 428/661 |
| 2006/0008942 A1* | 1/2006 | Romano et al. | 438/99 |

OTHER PUBLICATIONS

Becker et al.; "Atomic Layer Deposition of Insulating Hafnium and Zirconium Nitrides;" Chem Material, 2004, 16, pp. 3497-3501.
Lim et al.; "Synthesis and Characterization of Volatile, Thermally Stable, Reactive Transition Metal Amidinates;" Inorganic Chemistry; 2003; 42, pp. 7951-7958.
Farkas et al.; "FTIR Studies of the Adsorption/Desorption Behavior of Cu Chemical Vapor Deposition Precursors on Silica;" Journal of Electromechanical Society vol. 141, No. 12, Dec. 1994; pp. 3547-3555.
Moberg et al.; "Electroless Deposition of Metals onto Organosilane Monolayers;" Journal of Electromechanical Society vol. 144, No. 6, Jun. 1997; pp. L151-L153.
Biercuk et al.; "Low-temperature atomic-layer-deposition lift-off method for microelectronic and nanoelectronic applications;" Applied Physics Letters, vol. 83, No. 12, Sep. 22, 2003, pp. 2405-2407.
Lim et al.; "Atomic layer deposition of transition metals;" Natural Materials, vol. 2, Nov. 2003; pp. 749-754.
Yokoyama et al.; "Atomic-layer selective deposition of silicon nitride on hydrogen-terminated Si surfaces;" Applied Surface Science 130-132 (1998); pp. 352-356.

(Continued)

*Primary Examiner*—Caridad Everhart
(74) *Attorney, Agent, or Firm*—Cantor Colburn LLP; Lisa U. Jaklitsch

(57) ABSTRACT

A method for forming a conductive wire structure for a semiconductor device includes defining a mandrel on a substrate, forming a conductive wire material on the mandrel by atomic layer deposition, and forming a liner material around the conductive wire material by atomic layer deposition.

17 Claims, 24 Drawing Sheets

OTHER PUBLICATIONS

Utriainen et al.; "Studies of metallic thin film growth in an atomic layer epitaxy reactor using M(acac)2 (M=Ni, Cu, Pt) precursors;" Applied Surface Science 157 (2000); pp. 151-158.

Becker et al.; "Diffusion barrier properties of tungsten nitride films grown by atomic layer deposition from bis(tert-butylimido) bis(dismethylamido)tungsten and ammonia;" Applied Physics Letters; vol. 82, No. 14; Apr. 7, 2003; pp. 2239-2241.

Mikami et al.; "Robust self-assembled monolayer as diffusion barrier for copper metallization;" Applied Physics Letters; vol. 83, No. 25; Dec. 22, 2003; pp. 5181-5183.

Hausmann et al.; "Highly conformal atomic layer deposition of tantalum oxide using alkylamide precursors;" Thin Solid Films 443 (2003) pp. 1-4.

Becker et al.; "Highley Conformal Thin Films of Tungsten Nitride Prepared by Atomic Layer Deposition form a Novel Precursor;" Chem. Materials, 2003, 15, 2969-2976.

Semaltianos et al.; "Copper nucleation by chemical vapour deposition on organosilane treated SiO2 surfaces;" Surface Science 562 (2004) 157-169.

Guo et al.; "Site-specific reactivity of oxygen at Cu(110) step defects: an STM study of ammonia dehydrogenation;" Surface Science 367 (1996) L95-L101.

"Control of selectivity during chamical vapor deposition of copper from copper (I) compounds via silicon dioxide surface modification" Applied Physics Letters, vol. 61, No. 22, Nov. 30, 1992, pp. 2662-2664 Jain, et al.

Afsin et al. "Reaction pathways in the oxydehydrogenation of ammonia at Cu(110) surfaces;" Surface Science 284 (1993) 109-120.

* cited by examiner

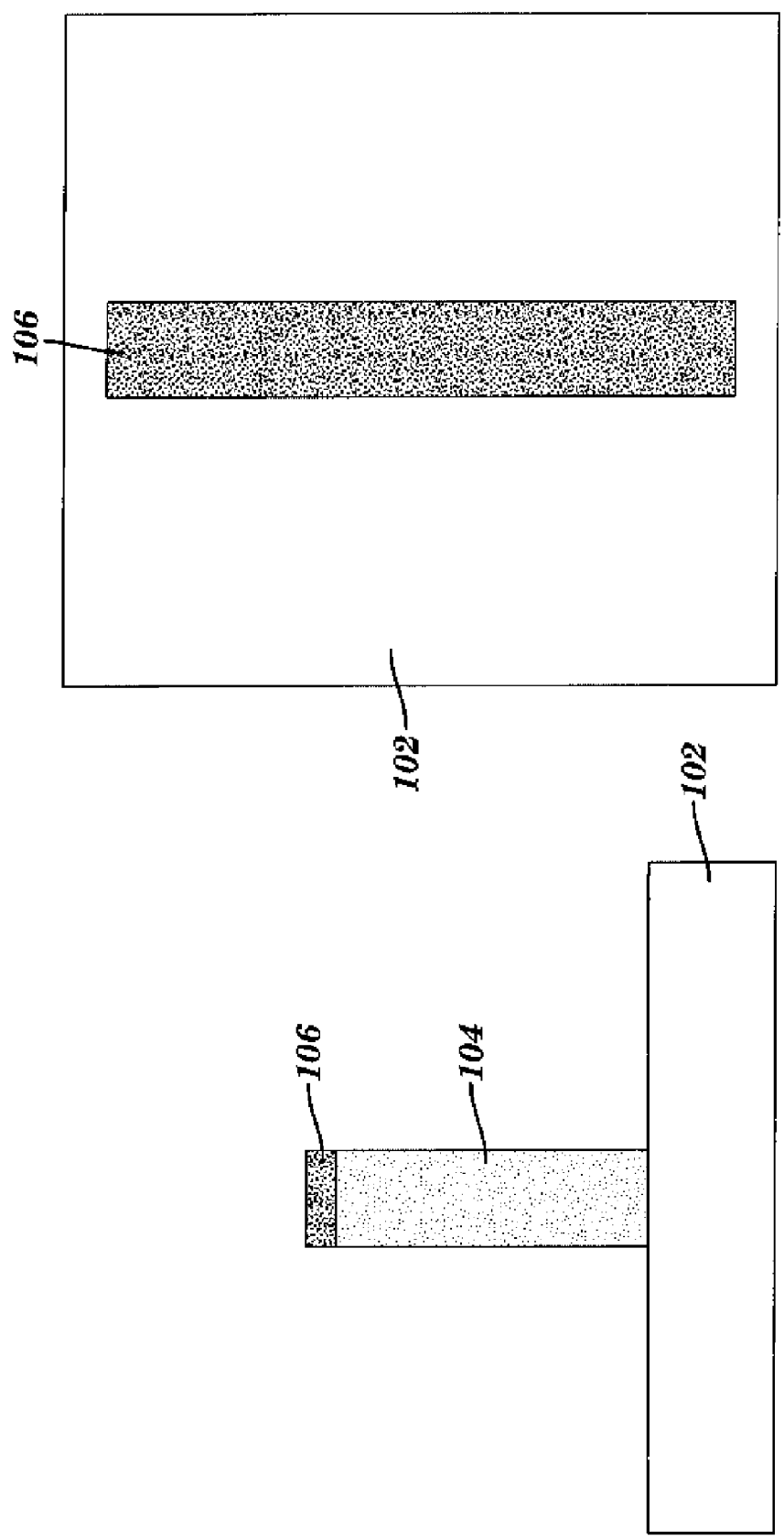

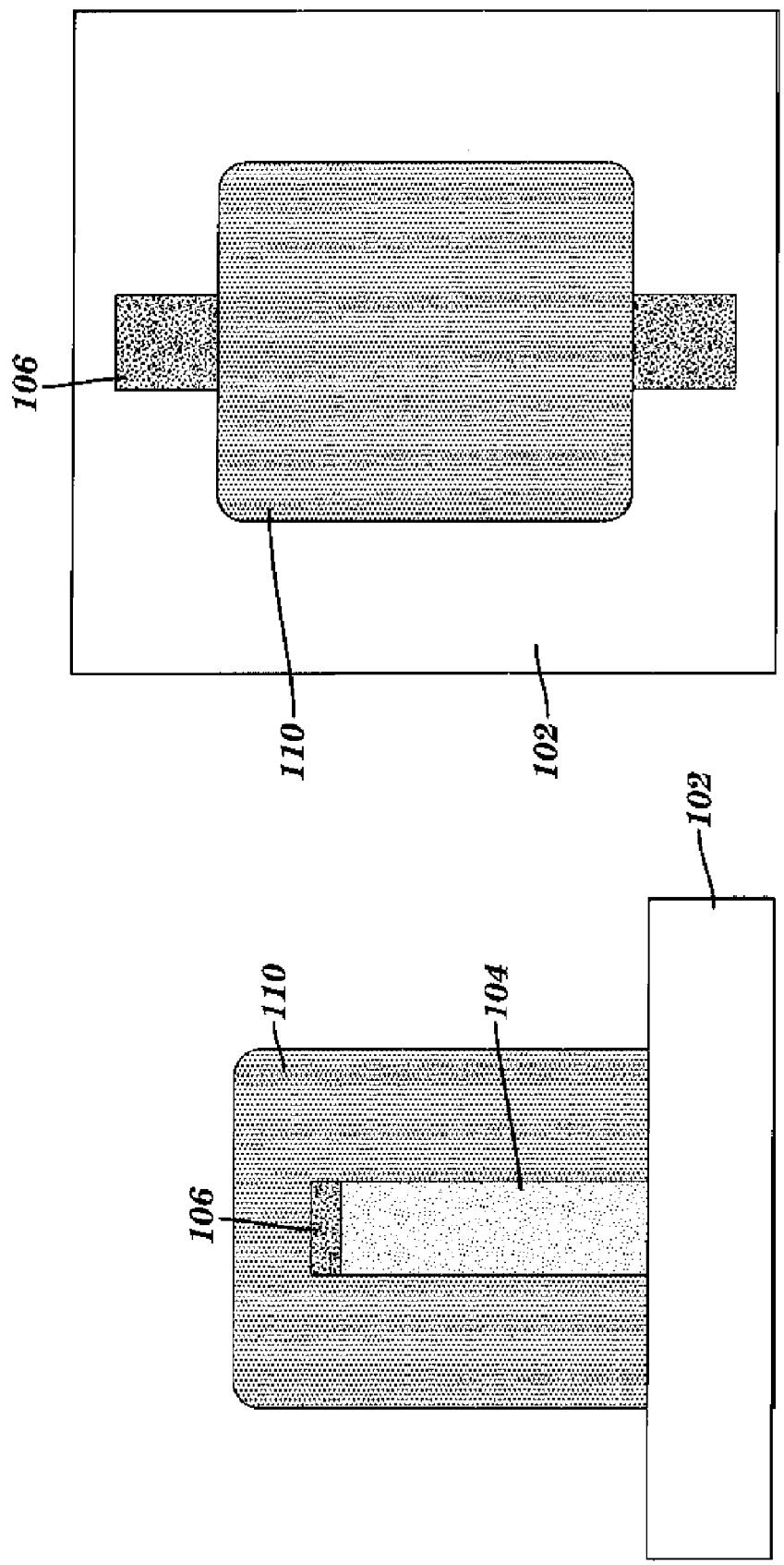

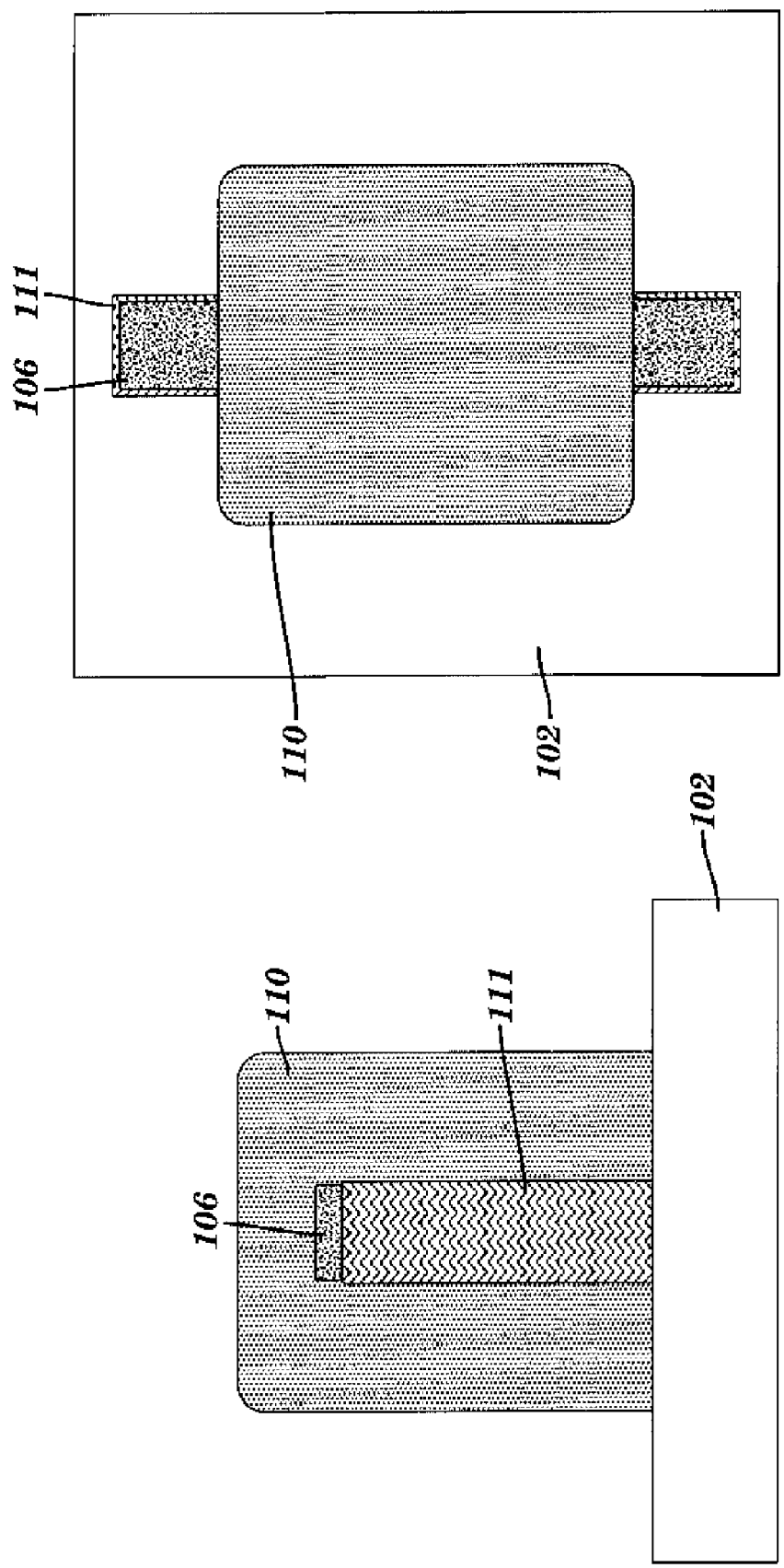

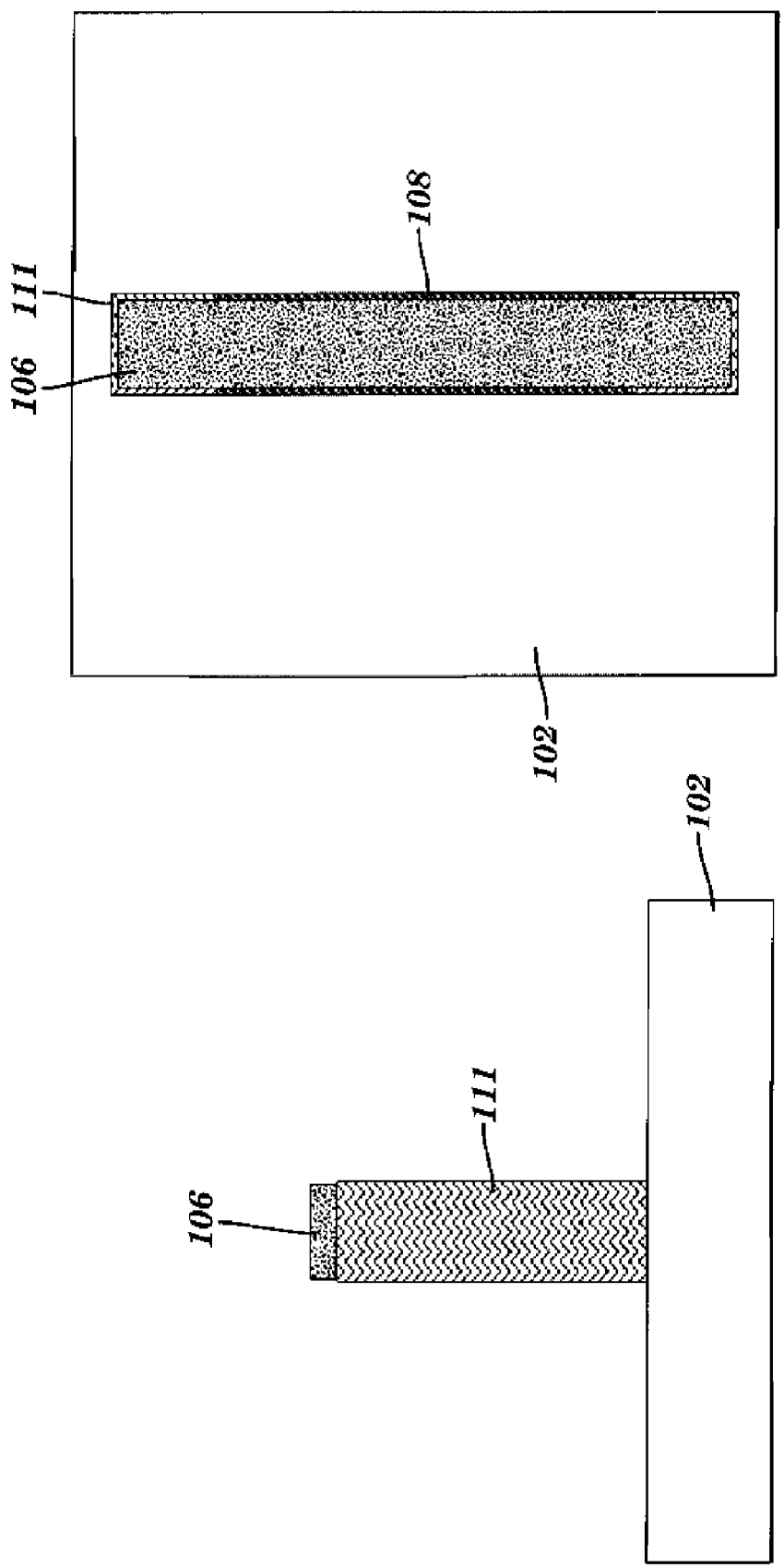

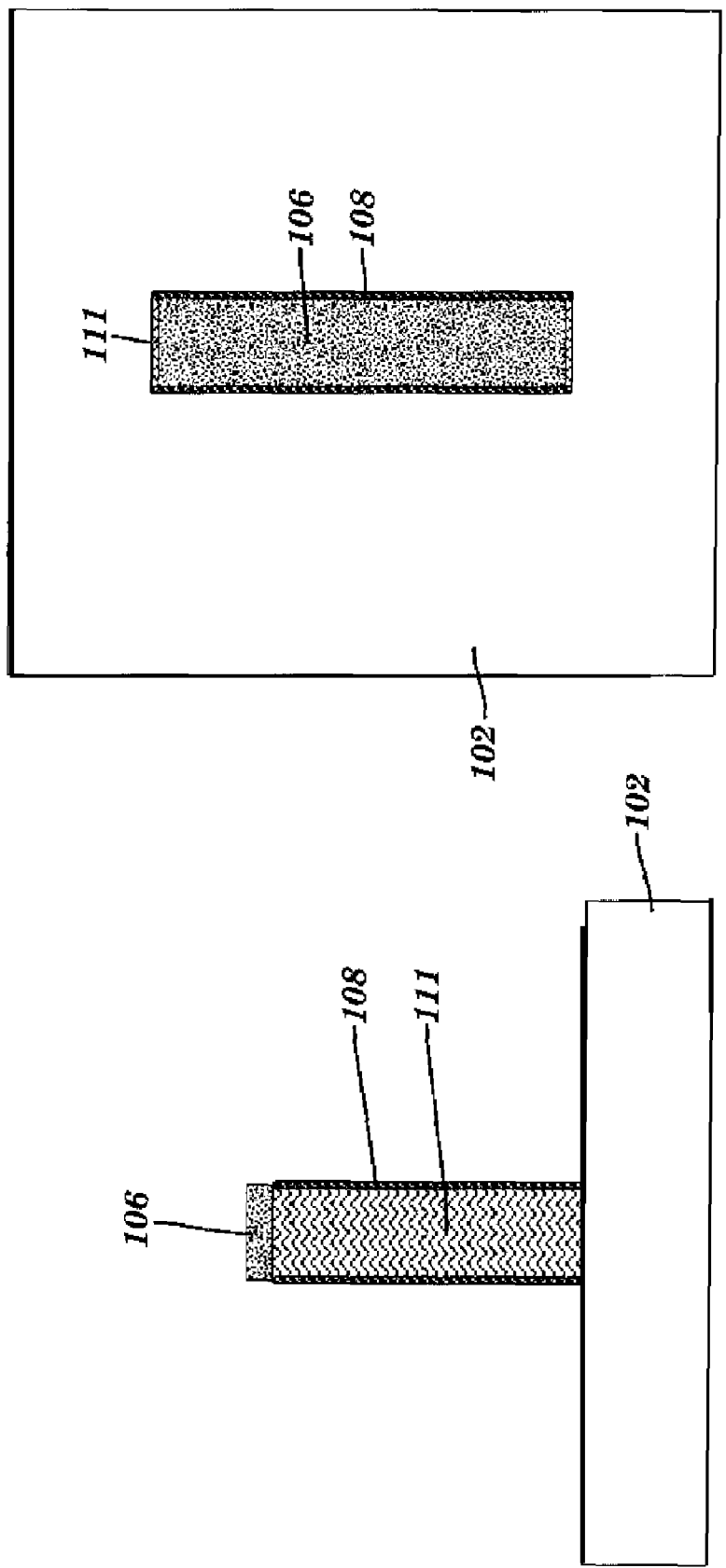

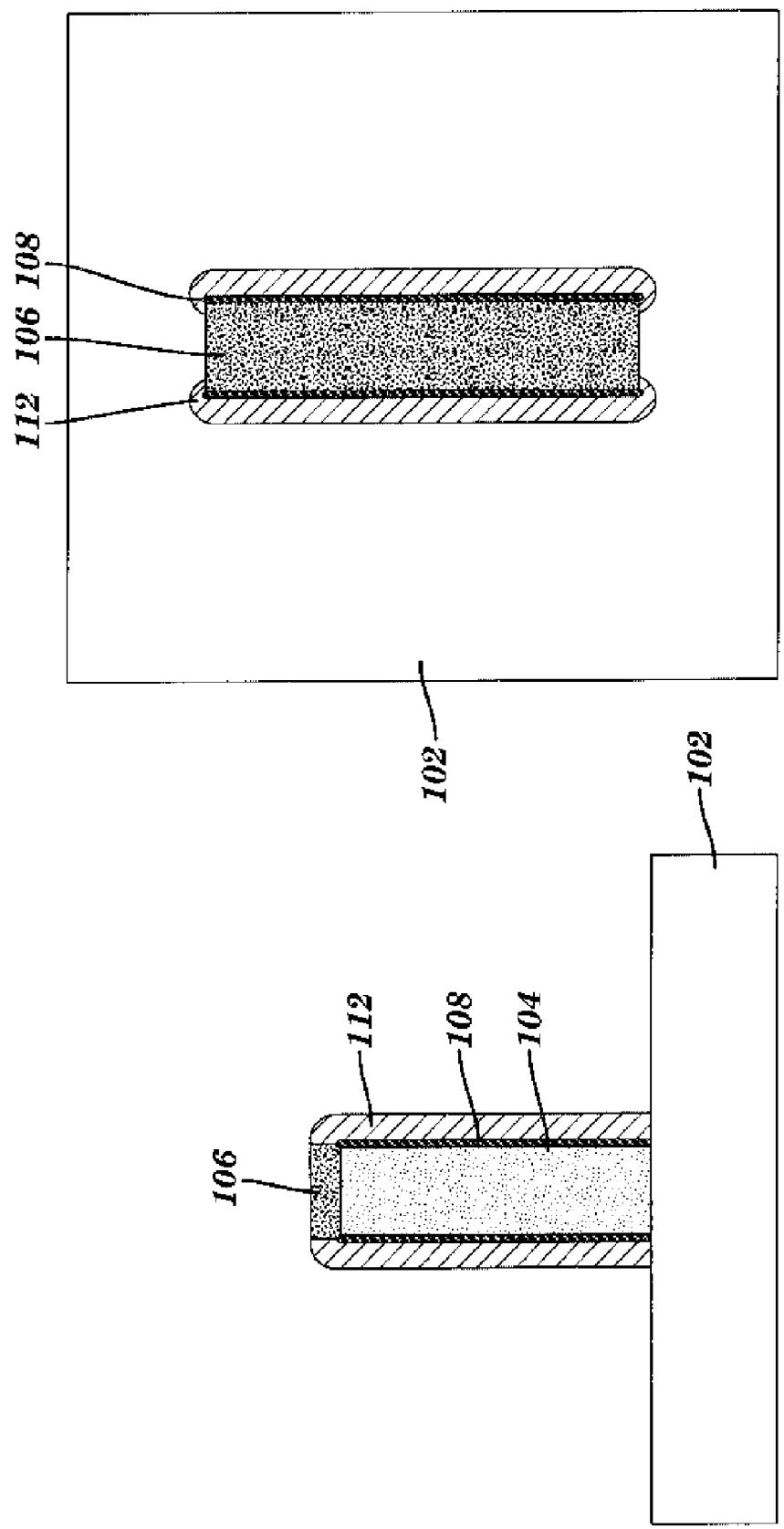

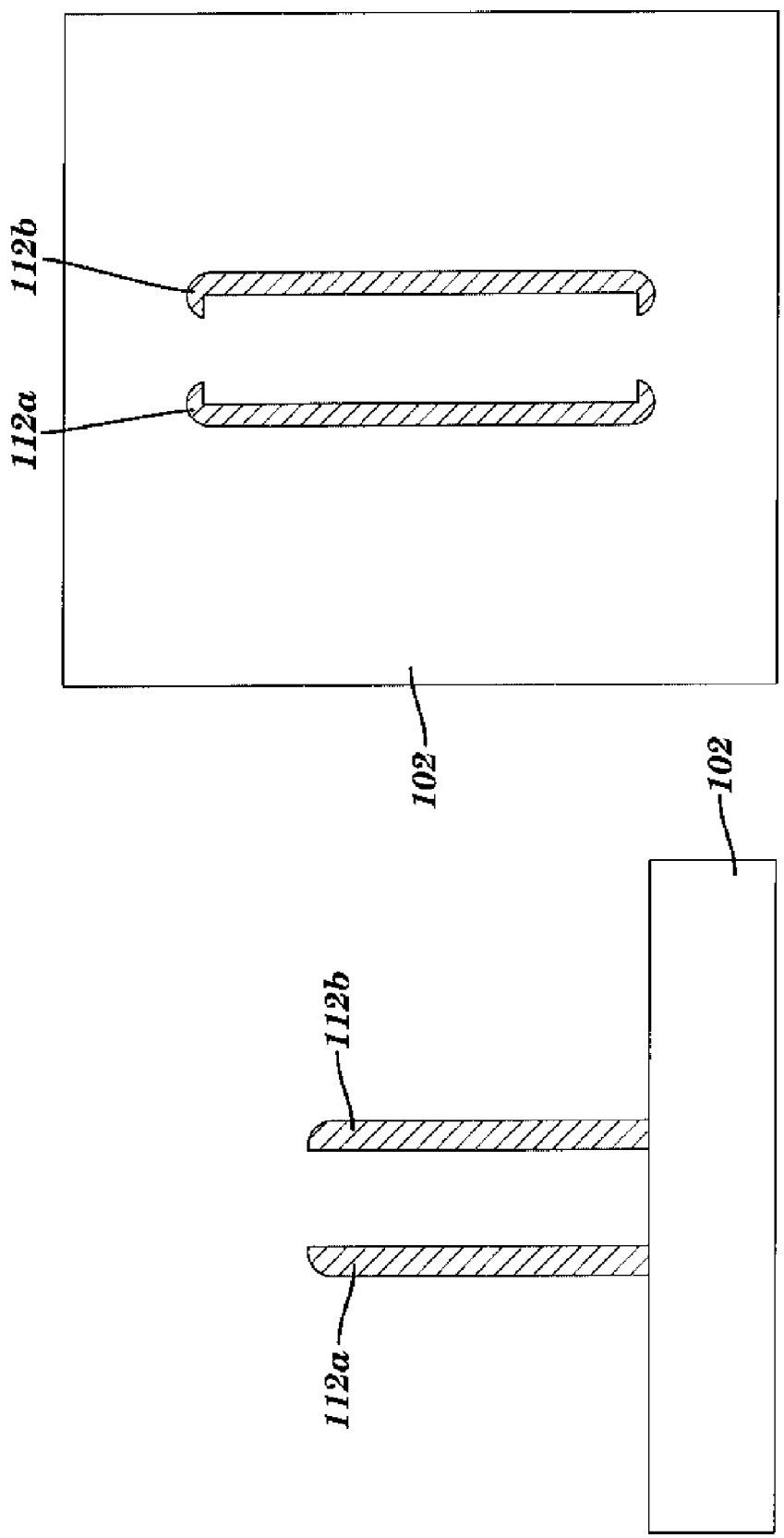

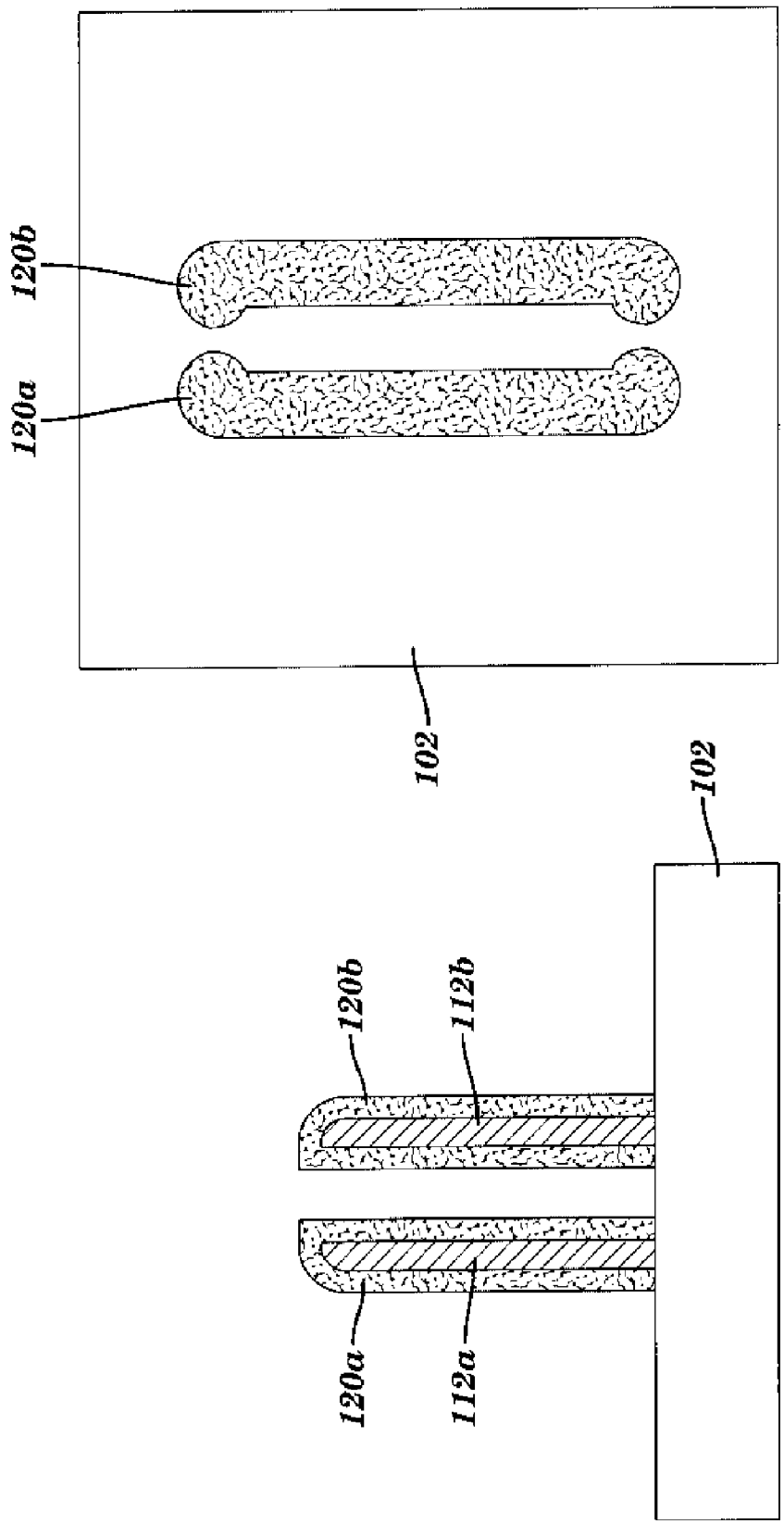

STRUCTURE AND METHOD FOR FORMING SEMICONDUCTOR WIRING LEVELS USING ATOMIC LAYER DEPOSITION

BACKGROUND

The present invention relates generally to semiconductor device manufacturing, and, more particularly, to a structure and method for forming semiconductor wiring levels using atomic layer deposition (ALD).

In the semiconductor industry, there is a continuing trend toward higher device densities by scaling down the device dimensions on semiconductor wafers (e.g., at submicron levels). In order to accomplish such high device packing density, smaller and smaller feature sizes are required. These feature sizes may include, for example, the width and spacing of interconnecting conductive lines, spacing and diameter of contact holes, and the surface geometry such as corners and edges of various device structures.

The requirement of small features (and close spacing between adjacent features) in turn requires high-resolution photolithographic processes. In general, lithography refers to processes for pattern transfer between various media. More specifically, it is a technique used for integrated circuit fabrication in which a silicon slice (i.e., the wafer) is coated uniformly with a radiation-sensitive film (i.e., the resist), and an exposing source (such as optical light, X-rays, or an electron beam) illuminates selected areas of the surface through an intervening master template (i.e., the photomask) for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating, thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. However, such lithography is not without limitations. Patterning features having dimensions of about 100 nanometers or less with acceptable resolution is difficult at best, and almost impossible in certain circumstances. At these dimensions, the tolerances become very difficult to control. Patterning conductive features with small dimensions, such as conductive metal lines for example, is required in order to participate in the continuing trend toward higher device densities. Accordingly, it has become desirable to obtain alternative methods of scaling conductive wiring in order to provide enhanced resolution, tolerance control, and improved critical dimension values.

SUMMARY

The foregoing discussed drawbacks and deficiencies of the prior art are overcome or alleviated by a method for forming a conductive wire structure for a semiconductor device. In an exemplary embodiment, the method includes defining a mandrel on a substrate, forming a conductive wire material on the mandrel by atomic layer deposition, and forming a liner material around the conductive wire material by atomic layer deposition.

In another embodiment, a method for forming a conductive wire structure for a semiconductor device includes defining a sacrificial structure on a substrate, forming a first liner layer on sidewalls of the sacrificial structure by atomic layer deposition, and forming a conductive wire material on the first liner layer by atomic layer deposition. A portion of the sacrificial structure is removed so as to expose a portion of said first liner layer, and a second liner layer is formed over exposed portions of the conductive wire material.

In still another embodiment, a conductive wire structure for a semiconductor device includes a conductive wire material formed by atomic layer deposition, and a liner material formed around said conductive wire material by atomic layer deposition.

BRIEF DESCRIPTION OF THE DRAWINGS

Referring to the exemplary drawings wherein like elements are numbered alike in the several Figures:

FIGS. 1 through 11 are a series of cross sectional and top down views of process flow steps illustrating a method for forming narrow conductive wire structures for semiconductor devices, in accordance with an embodiment of the invention;

FIGS. 12 through 21 illustrating an alternative patterning and processing embodiment with respect to the steps shown in FIGS. 4 through 11; and FIGS. 22 through 24 are a series of cross sectional and top down views of process flow steps illustrating a method for forming narrow conductive wire structures for semiconductor devices, in accordance with an alternative embodiment of the invention.

DETAILED DESCRIPTION

Disclosed herein is a structure and method for forming semiconductor wiring levels having improved tolerance values and aspect ratios independent of existing photolithography constraints, resulting in higher yield and lower capacitance when scaling devices. Briefly stated, the wiring structures are formed by atomic layer deposition (ALD) on sidewalls of a lithographically defined mandrel such as a resist or a dielectric film. In one embodiment, a liner material is formed by selective ALD on the mandrel surface (activated by a seed layer), followed by conductive wire material formation on the liner material (again by selective ALD), followed by additional liner material deposition to encapsulate the conductive wire. The mandrel may or may not be removed before continuing device processing. In another embodiment, the wire metal is deposited on the mandrel by selective ALD without a liner. The mandrel is then removed, followed by a subsequent formation of a protective liner by selective ALD of liner material on the wire metal material. Regardless of the specific embodiment implemented, a uniformity of the resulting narrow wire structure is achieved with a high aspect ratio and critical dimension distribution, which does not suffer from the large through-pitch variations typically associated with conventional optical lithographic techniques.

Referring generally to FIGS. 1 through 11, there is shown a series of process flow steps illustrating a method for forming a conductive wire structure on sidewalls of a lithographically defined mandrel, in accordance with an embodiment of the invention. As shown in the cross sectional view of FIG. 1(a) and the corresponding top down view of FIG. 1(b), a substrate 102 (e.g., silicon, dielectric material) has a mandrel 104 (which may also be considered a sacrificial structure for certain embodiments) formed thereon. The mandrel 104 may be formed from a material such as an oxide, a siloxane, a low-k dielectric, an organic, or a resist, to name a few examples. In the specific example depicted, the mandrel 104 includes a silicon oxide material having a nitride cap 106 thereupon.

Figures 2A, 2B:
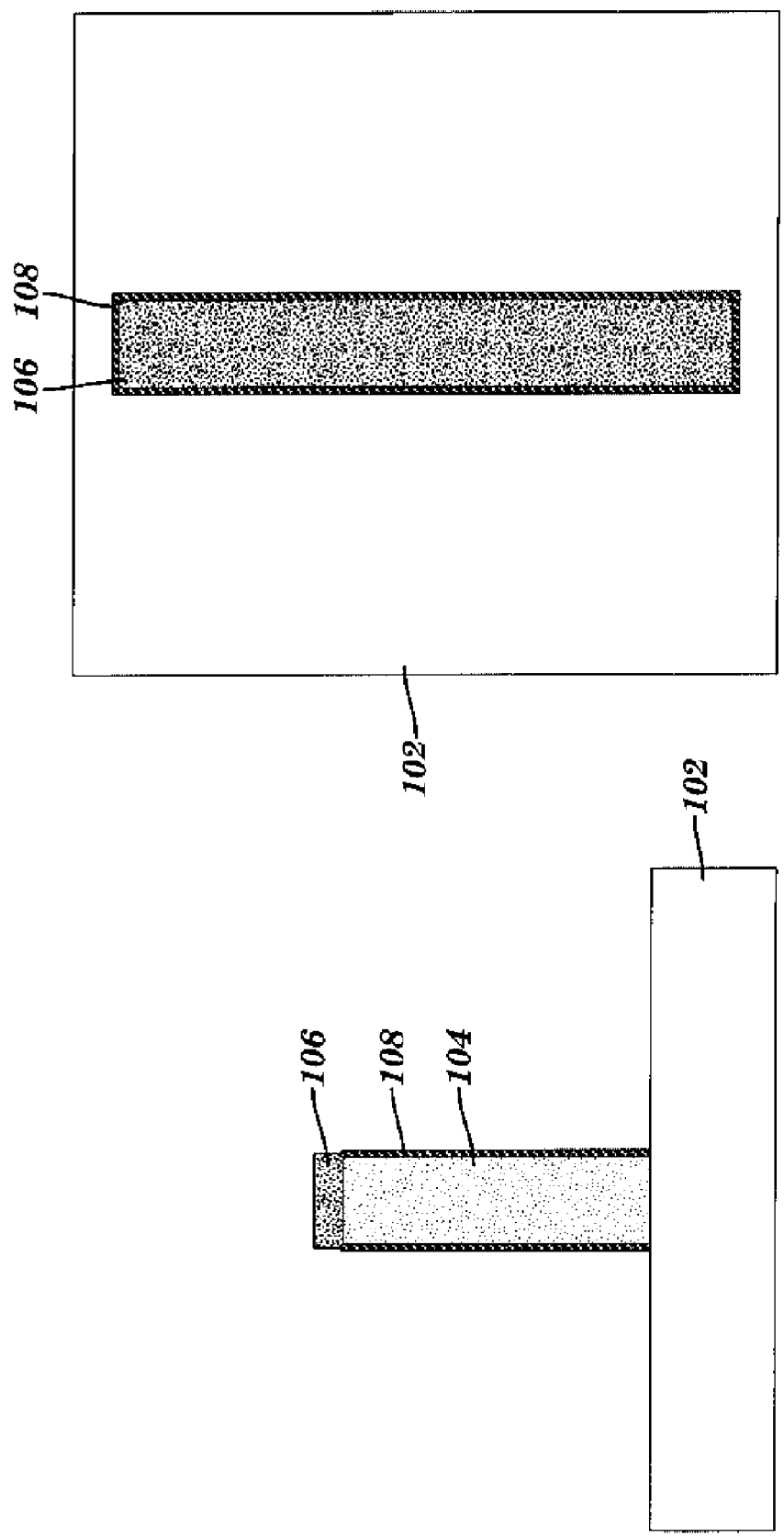

In FIGS. 2(a) and 2(b), a spacer material 108 is formed on the exposed sidewalls of the mandrel 104. The sidewall spacer material 108 may include a maleic anhydride (plasma) polymer or a poly di-aminoethane plasma polymer, for example, that contains a reactive site for a subsequent atomic layer deposition. In particular, a maleic anhydride polymer can be subsequently activated by multifunctional amines such that the sidewall spacer material 108 acts as a seed layer for ALD of a subsequent liner material. Also, where the mandrel 104 is formed from a hardbaked resist material, the surface thereof may be treated with an oxygen RIE or sulfuric/peroxide wet acid to create carboxylic acid functionality on the resist surfaces, or treated with ammonia plasma to create amine reactive sites on the resist surfaces.

Figures 3A, 3B:
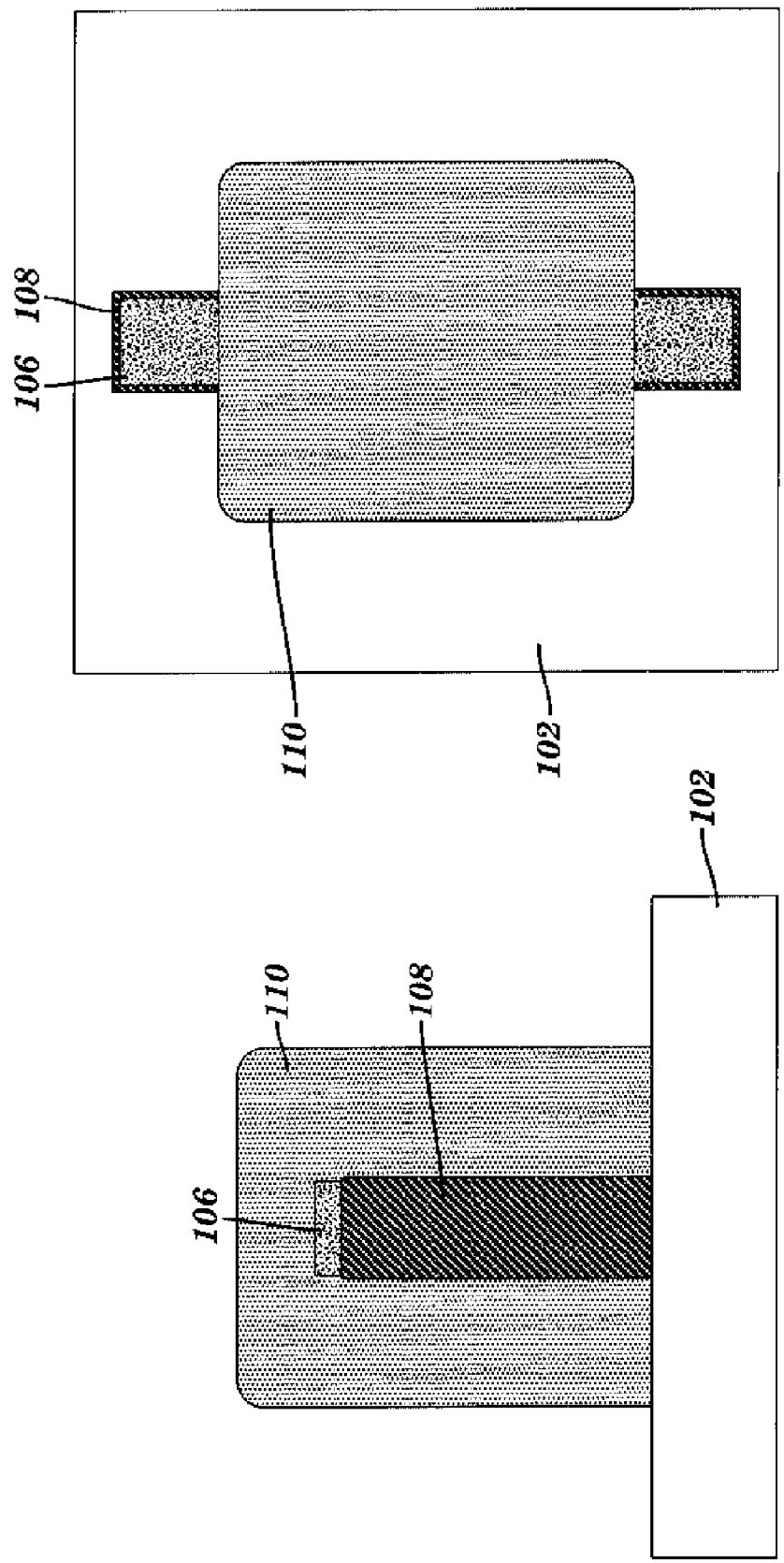

Then, in FIGS. 3(a) and 3(b), the mandrel structure is masked with patterned photoresist 110 so as to define the areas of subsequent metal wire formation by ALD. Exposed portions of the maleic anhydride spacer material 108 left unprotected by the resist 110 are subsequently removed (with ozone or an oxygen plasma, for example) as shown in FIGS. 4(a) and 4(b). Then, the wafer is processed with alkyl(tris-methoxy)silane so as to mask the newly exposed oxide surfaces of the mandrel structure with an unreactive siloxane surface layer 111 to enhance sidewall selectivity, as shown in FIGS. 5(a) and 5(b). The siloxane can be reacted in the vapor or as a solvent solution (typically with a baking step in order to complete the surface reaction and avoid the presence of reactive functionalities on the modified surface), and the resist layer 110 is then removed with solvent, as shown in FIGS. 6(a) and 6(b). Alternatively, a range of possible silylation agents could be used, including, for example, mono-, di-, or tri-alkoxy(alkyl)silanes, chloro (alkyl)silanes, bromo (alkyl) silanes, thiocyanate(alkyl) silanes, phosphonates or similar materials. Bulky and unreactive alkyl, aryl or similar groups may be used to mask the surface of the substrate against reactivity with the atomic layer deposition reagents for the metal or metal liner materials. Possible akyl groups are Tert-butyl, adamantyl, isopropyl, n-butyl, and other branched or straight chain alkyl groups. Examples of aryl groups are phenyl, mesityl, or alkyl-substituted aryl materials. As indicated above, the freshly exposed maleic anhydride surface may then be activated by processing with a solvent solution of dendritic amine.

Figure 7:
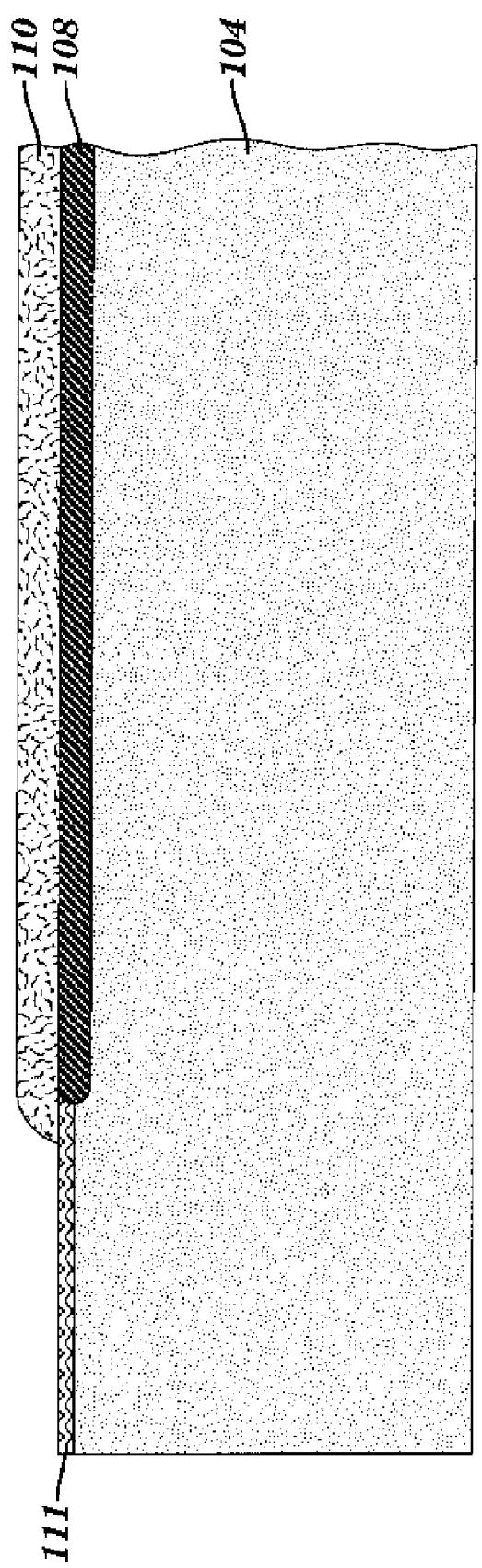
Figure 8:
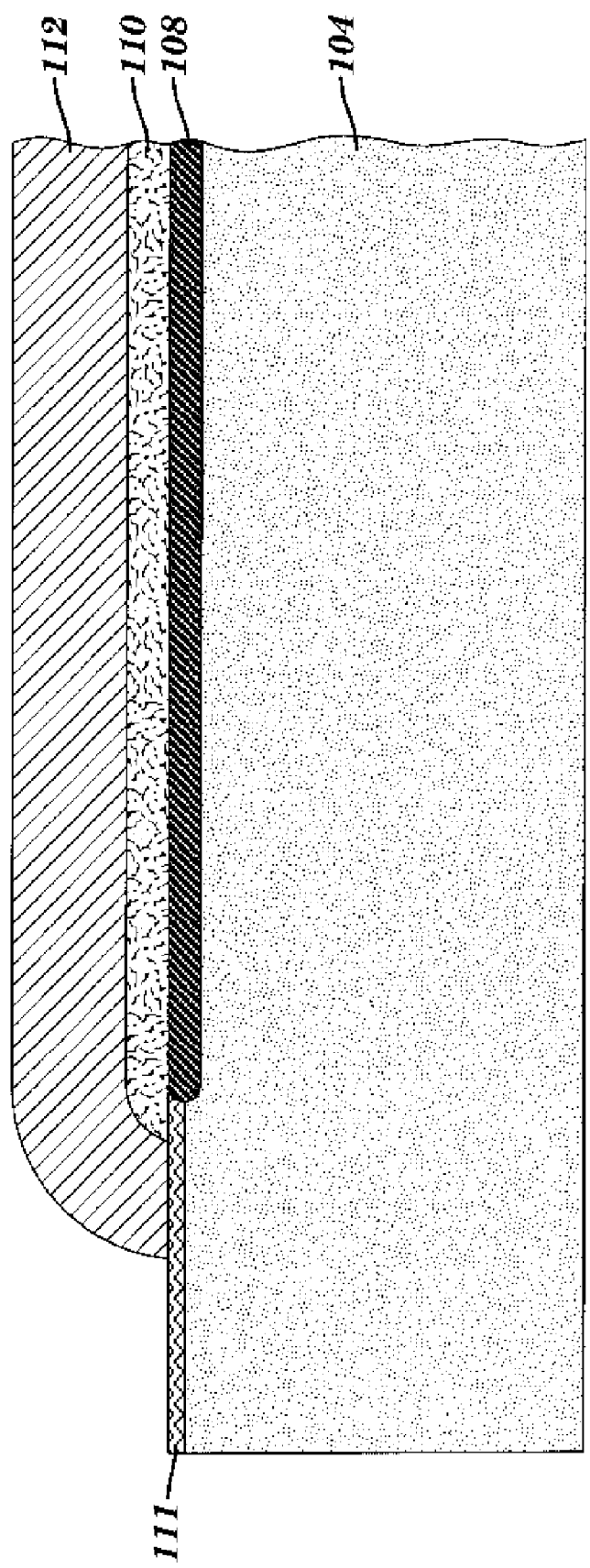

Referring now to FIGS. 7 and 8, there is shown an enlarged, top down sectional view that particularly illustrates the formation of a first liner layer (FIG. 7) and a conductive wire (FIG. 8). For ease of illustration, the nitride cap 106 is not shown atop the mandrel 104. As can be seen in FIG. 7, a first liner layer 110 is uniformly deposited by ALD upon the seed layer 108 and a portion of the siloxane surface layer 111. In particular, the first liner layer 110 may be a metal nitride (including materials such as TiN, TaN, and WN, for example) or a metal (including materials such as Ta, Ti or W, for example) formed at an exemplary thickness of about 5 to about 25 angstroms (↑). It will be noted that the first liner layer 110 covers the edges of the seed layer 108, but does not otherwise form on the bare surface of the mandrel 104 following the trimming step of FIG. 4(b). While the first liner layer 110 is grown by ALD on the dendritic amine-coated surfaces, the silicon nitride layers and the siloxane-capped oxide layers remain unreactive to the ALD species (e.g., metal imides, metal amides, and ammonia or pyridine). During this and subsequent ALD steps, a periodic Ar sputter may be used to enhance sidewall selectivity.

After the first liner layer 110 (metal nitride) is grown, the metal for the conductive wire structure 112 is formed (i.e., selectively deposited) upon the conductive surfaces first liner layer 110 and a portion of the siloxane surface layer 111, again by ALD as shown in FIG. 8. Suitable metals for the conductive wire structure 112 include, but are not limited to, Cu, Pt, Ni and Ru. Cu may be selectively deposited by ALD onto conductive surfaces, using acetylacetonate or amidinates. Hydrogen may also be used to reduce the metal ions to metal, if desired. Pt and Ru may be selectively deposited by using organometallic reagents such as di(cyclopentadienyl)Ru or methylcycipentadienyl (trimethyl)Pt onto a metallic, typically with a baking step in order to complete the surface reaction and avoid the presence of reactive functionalities on the modified surface containing adsorbed oxygen.

Figure 9:
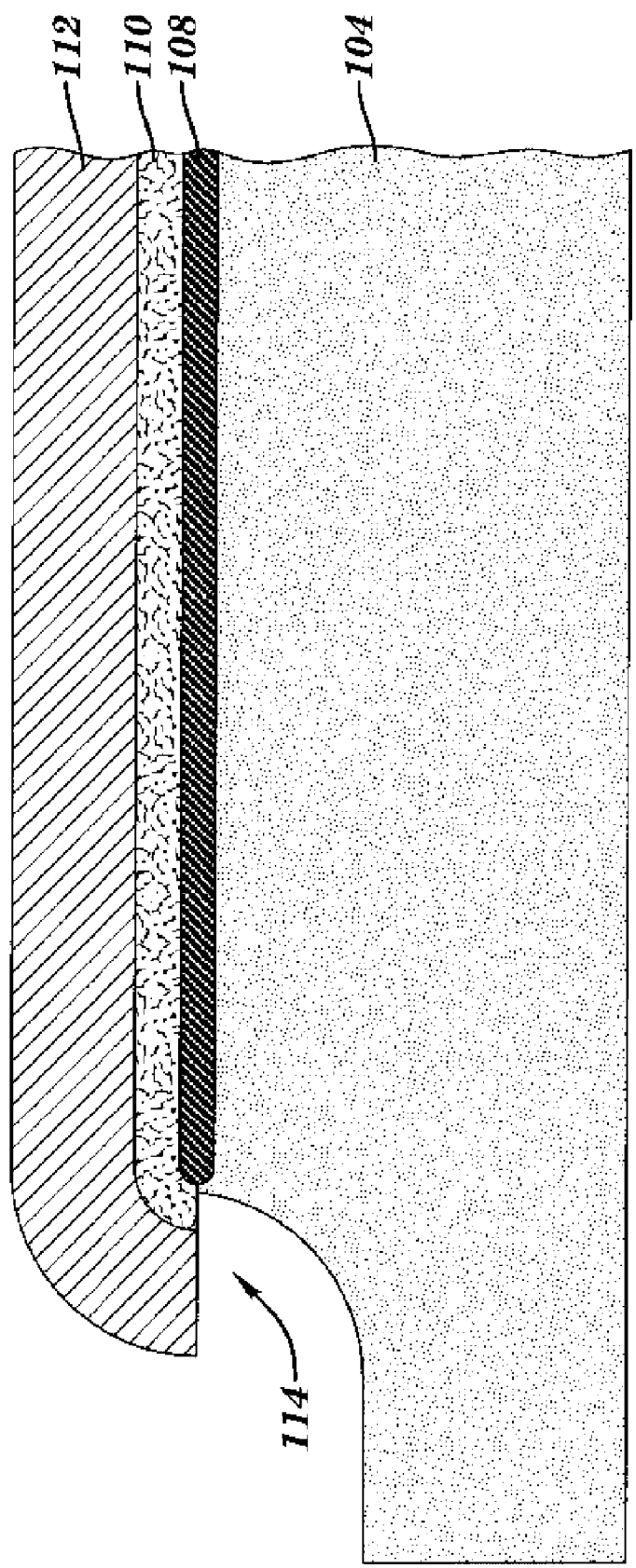
Figure 10:
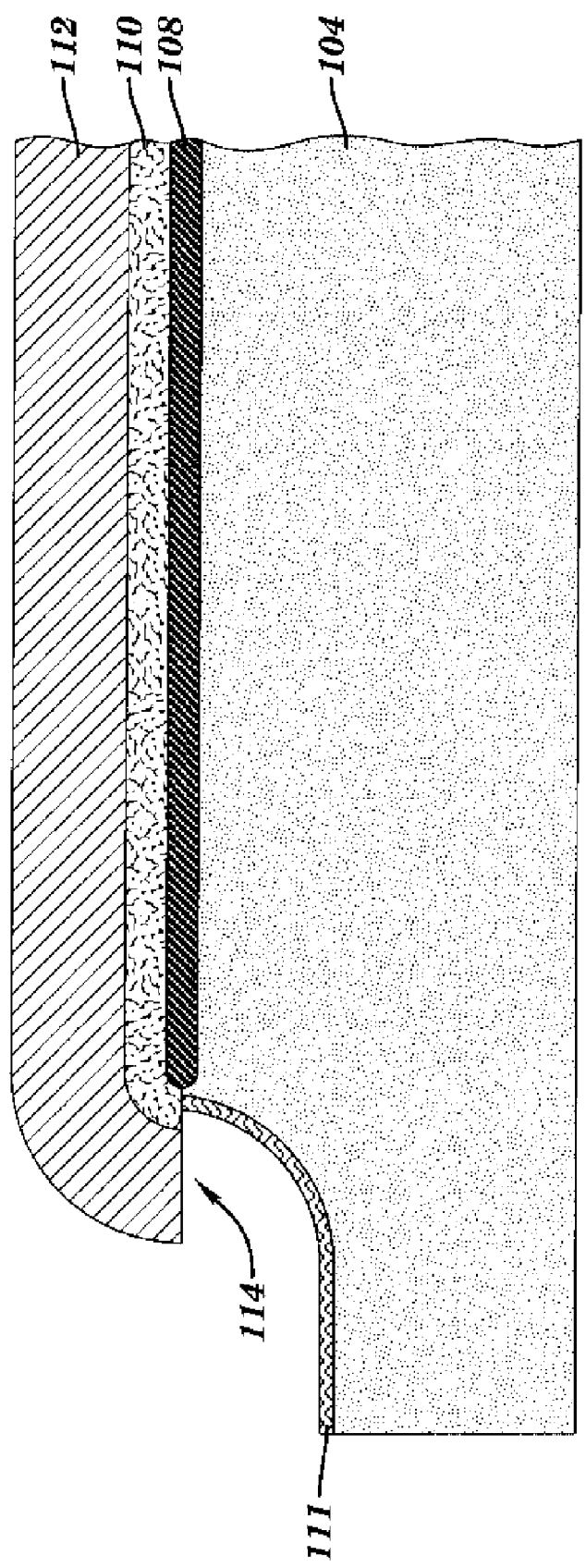

In order to completely surround the wire structure 112 with liner material for barrier protection against metal diffusion during subsequent device processing, a portion of the mandrel 104 is recessed back so as to expose the edge of the wire structure 112. This is particularly illustrated in FIG. 9, wherein a recess 114 is created within the mandrel 104, such as through a chemical oxide removal (COR) process (which uses HF and ammonia vapor, followed by baking, to selectively etch silicon oxide materials), for example. The removal of mandrel material (and siloxane surface layer 111) completely exposes the remaining surfaces of the wire structure 112 not in direct contact with the first liner layer 110. A small overlap of removed mandrel material is also shown in FIG. 9, with respect to the first liner layer 110. Thereafter, the freshly exposed oxide surfaces of the mandrel 104 may once again be masked with alkyl(tris-alkoxy) silane or other reactive masking materials listed above. For example, a newly formed siloxane surface layer 111 is shown in FIG. 10.

Figure 11:
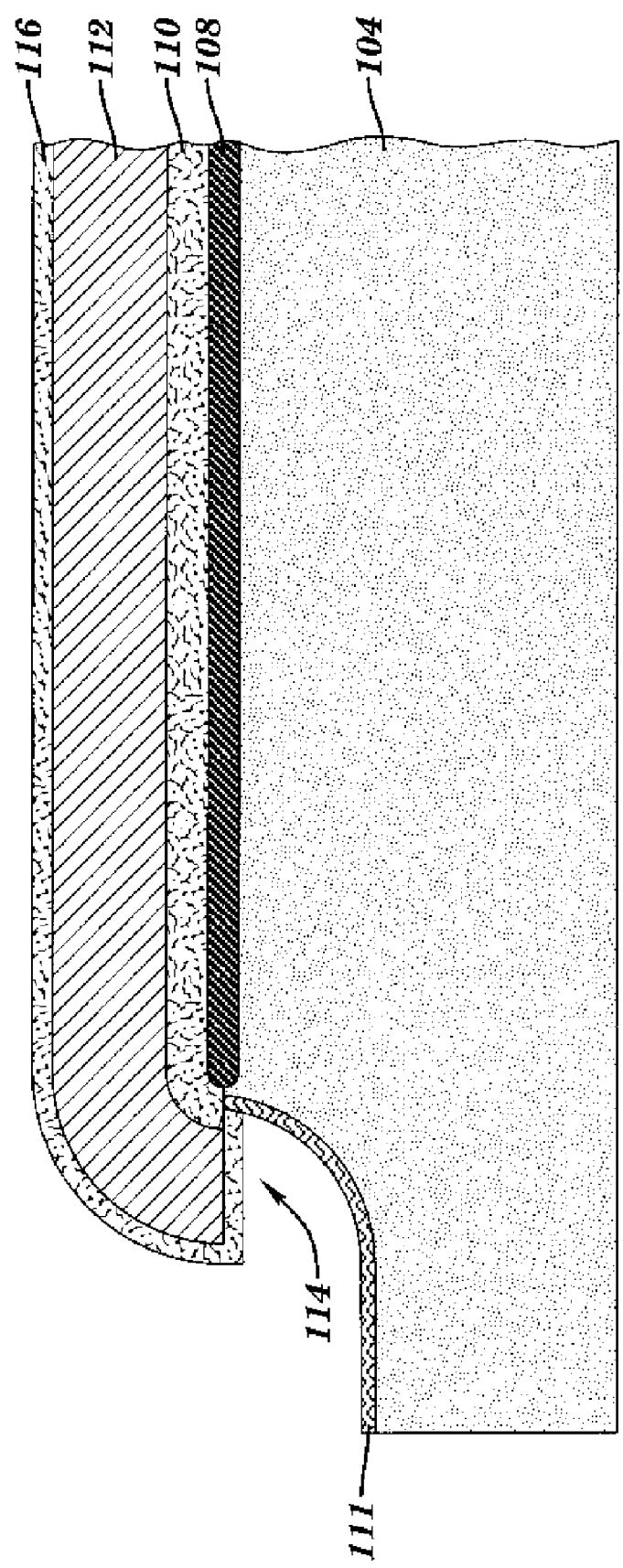

As shown in FIG. 11, a second liner layer 116 is formed by ALD over the remaining exposed surfaces (e.g., copper) of the wire structure 112 so as to encapsulate the same. Again, the second liner layer 116 may include metal amide or imide materials as the vapor deposition species to create the metal nitride or metal liner material (such as TiN, TaN, WN, Ti, Ta, and W, for example), formed at an exemplary thickness of about 5 to about 25 Å. Where copper is used for the conductive wire material, the copper may be activated with an $O_2/NH_3$ chemistry or oxygen/amine vapor, if desired, prior to forming the second liner layer 116 thereon. Following the formation of the second metal nitride liner layer 116, the wire structure is formed, including capping layers on the sides and upper surface of the copper wire. Once the wire structure 112 is encapsulated, the mandrel 104 (and nitride cap 106) may optionally be removed for subsequent BEOL processing, such as dielectric material formation and planarization. Alternatively, the mandrel 104 may be left in place for subsequent BEOL processing.

Figures 12A, 12B:
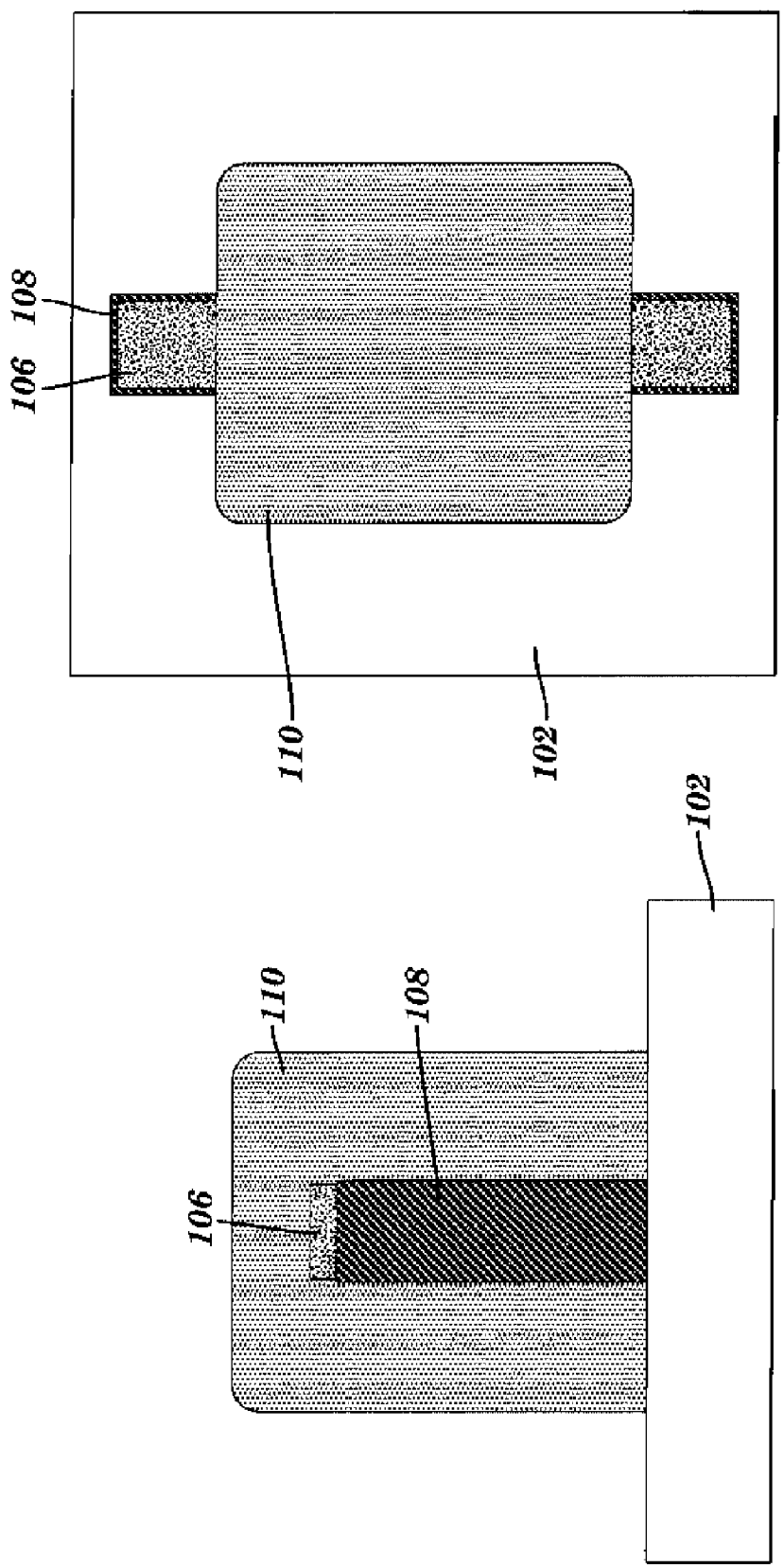
Figures 13A, 13B:
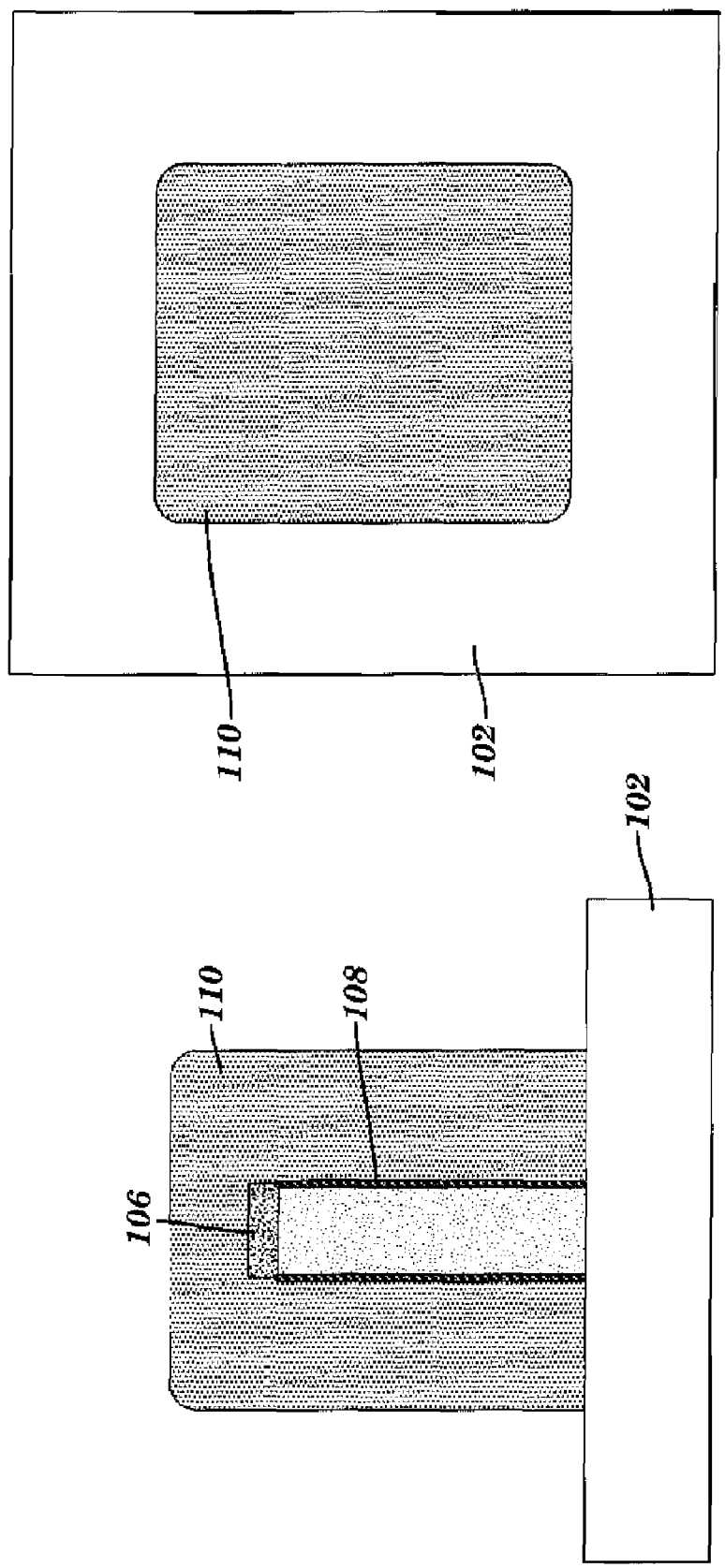
Figures 14A, 14B:
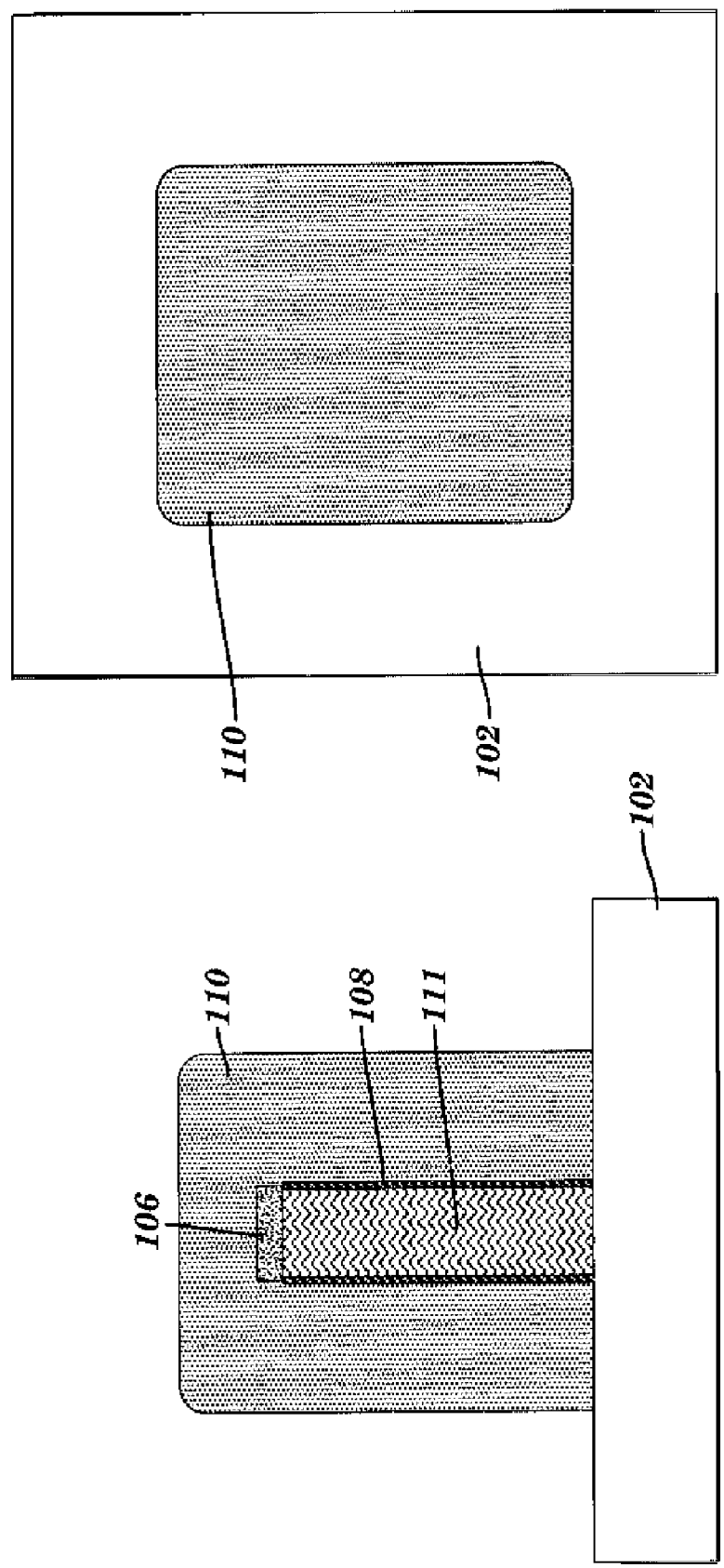
Figure 16:
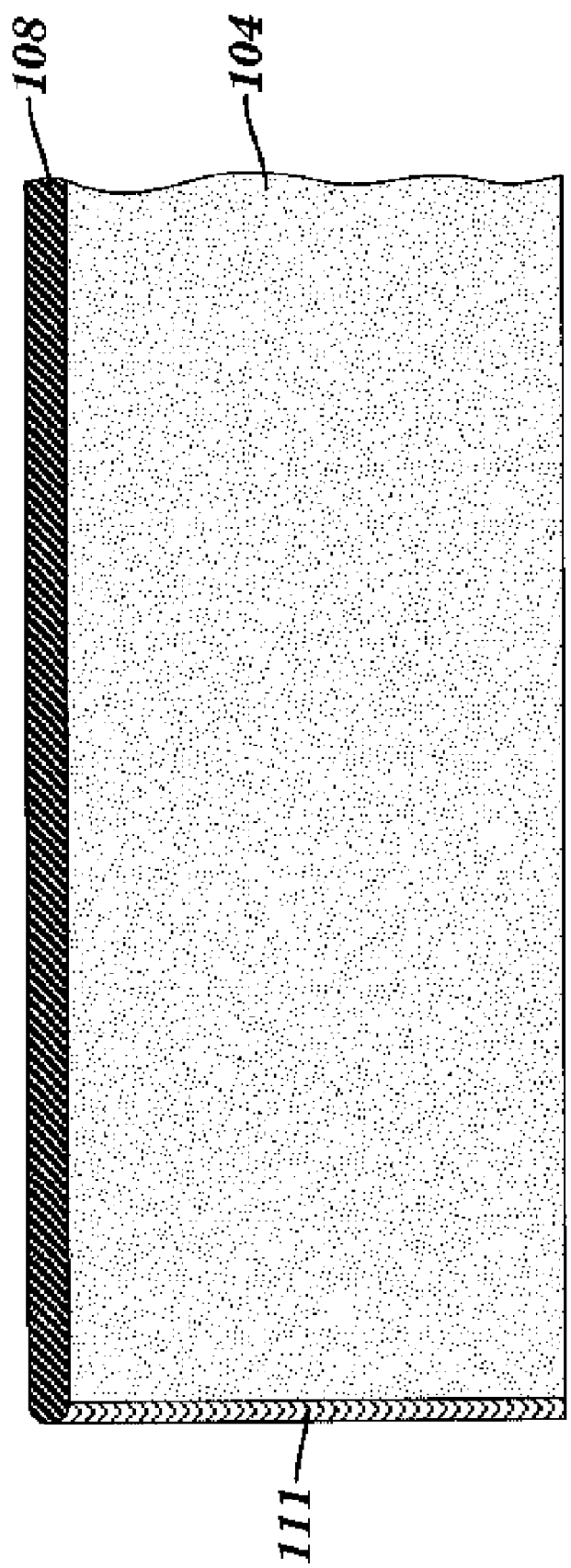

FIGS. 12(a) and 12(b) depict an alternative patterning embodiment of the mandrel 104 with respect to that shown in FIGS. 4(a) and 4(b). Following the resist patterning (trimming) step of previously described FIGS. 3(a) and 3(b), both the exposed portions of the spacer material (seed layer) 108 and mandrel 104 left unprotected by the resist 110 are subsequently removed as shown in FIGS. 13(a) and 13(b). Again, a siloxane may be used to form a siloxane surface layer 111 on the exposed edges of the mandrel, as particularly shown in FIG. 14(a). After the siloxane treatment and resist removal, the resulting mandrel structure is shown in FIGS. 15(a), 15(b) and 16, where the exposed edges of the mandrel 104 are protected with siloxane 111, while the entire length of the elongated sidewall portions of the mandrel 104 are covered by the sidewall spacer material 108.

Figure 17:
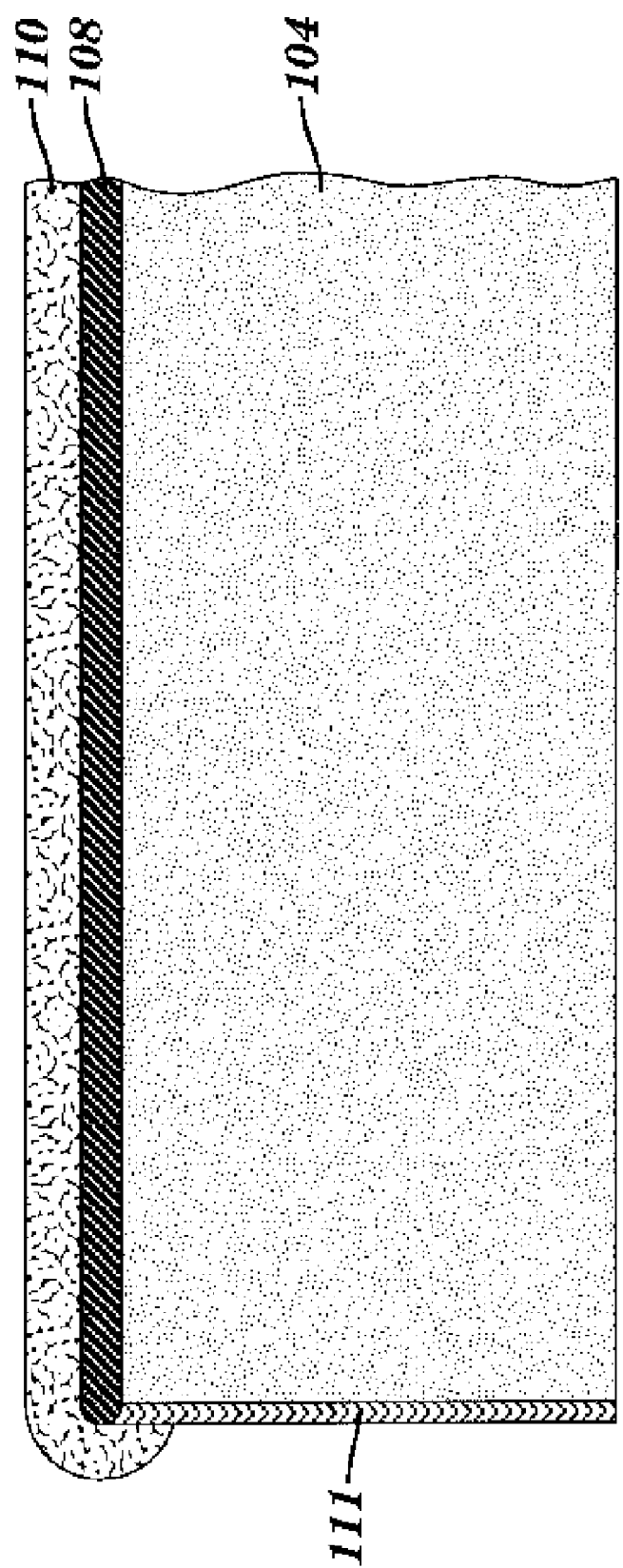
Figure 18:
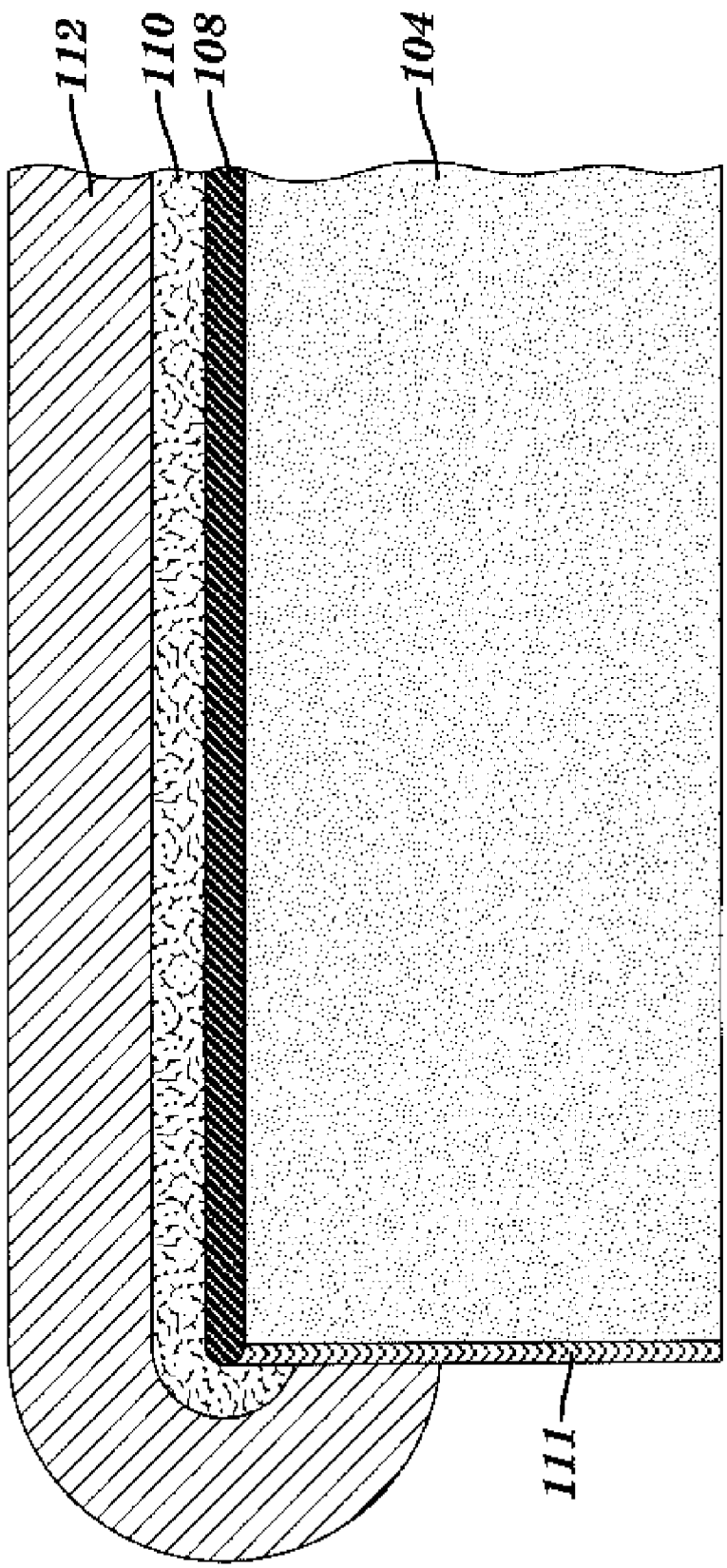
Figure 19:
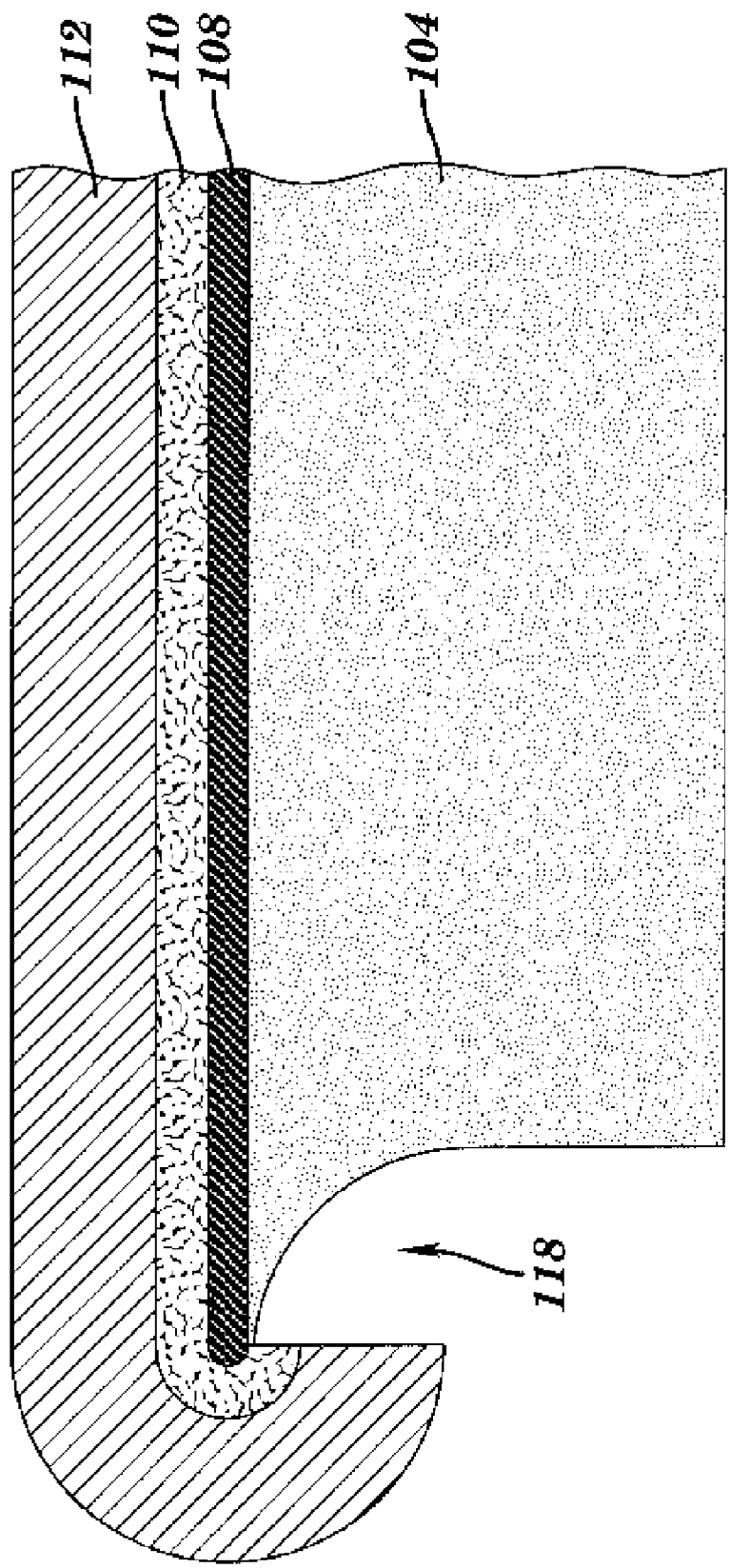
Figure 20:
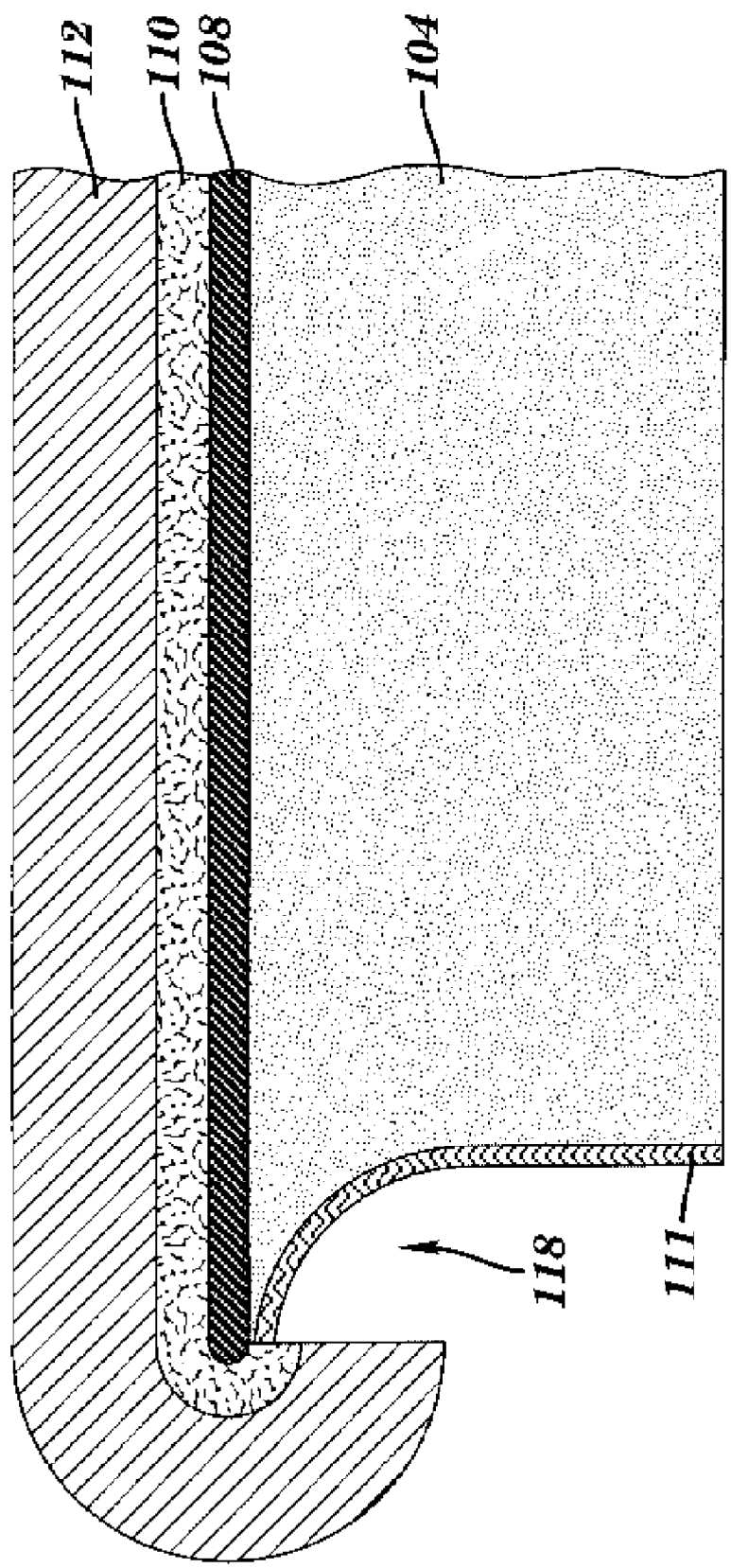

FIGS. 17 and 18 illustrate the formation of the first liner layer 110 and conductive wire structure 112 on the patterned mandrel 104. As compared to the embodiment of FIGS. 7 and 8, it will be seen that the first liner layer 110 and conductive wire structure 112 also wraps around to partially cover the siloxane covered edge of the mandrel 104 (as opposed to just the sidewalls). Again, a recess 118 is then created within the mandrel 104, such as through a chemical oxide removal (COR) process, for example, shown in FIG. 19. As is the case with the embodiment in FIG. 9, the removal of mandrel material in FIG. 19 completely exposes the remaining surfaces of the wire structure 112 not in direct contact with the first liner layer 110. Again The newly exposed oxide surface of the mandrel 104 may be re-passivated with alkylsiloxane, arylsiloxane, or phosponates, as described earlier, prior to the ALD deposition of the second (final) liner layer. FIG. 20 illustrates a newly formed siloxane surface layer 111.

Figure 21:
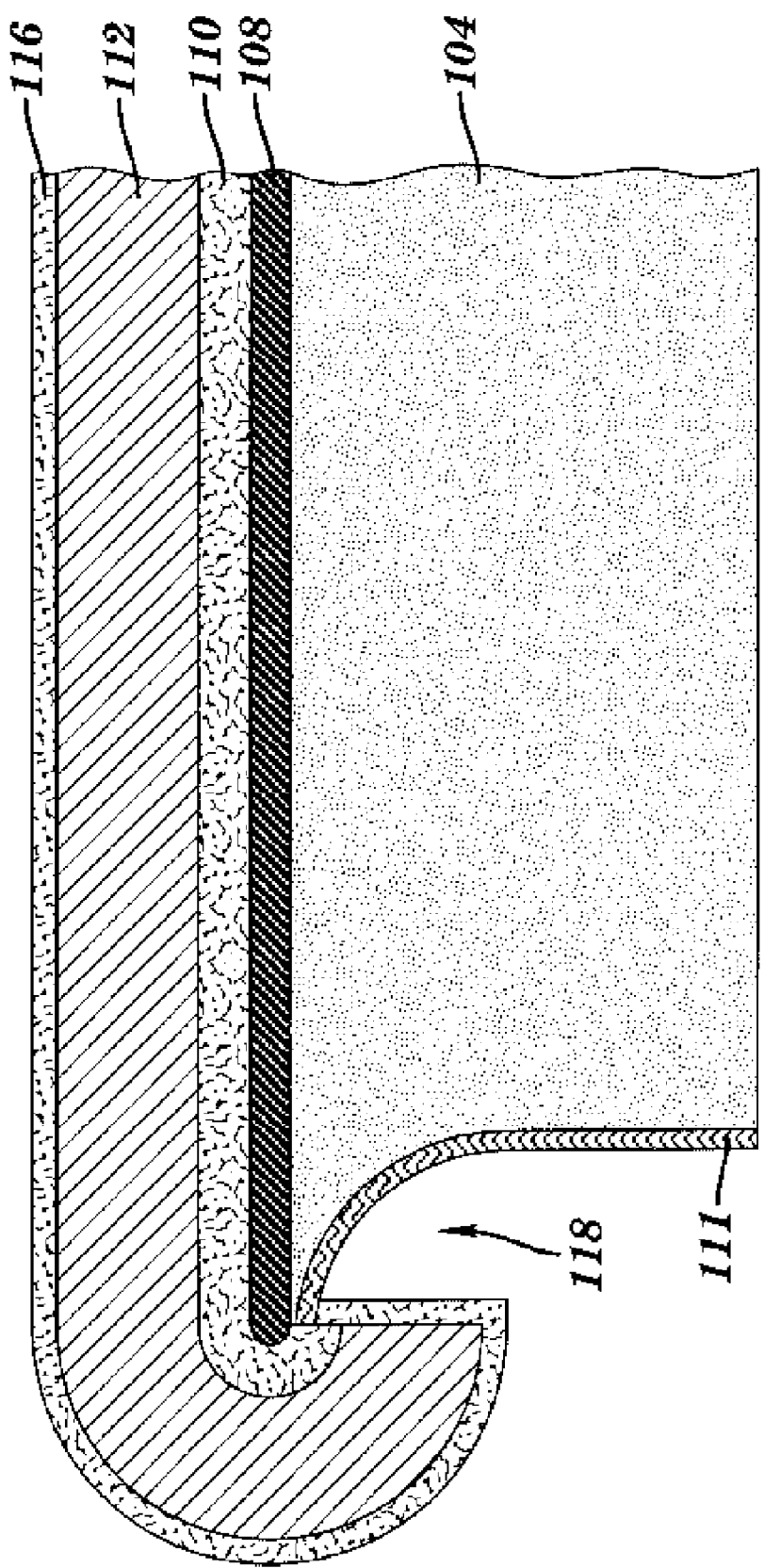

Proceeding to FIG. 21, the second liner layer 116 is formed (by ALD) over the remaining exposed surfaces of the wire structure 112 so as to encapsulate the same. An oxygen/ammonia, oxygen/amine, or amine vapor may be used to activate the copper surface prior to ALD of the liner material. The resulting liner-encapsulated wire structure 112 of this embodiment thus has a generally J-shaped appearance due to the initial wrap-around of the first liner 110 and wire metal over the edge of the mandrel 104.

Finally, FIGS. 22 through 24 depict still another embodiment of a conductive wire structure and method of forming the same, in which the liner material is not formed around the wire metal until after the removal of the sacrificial mandrel. In other words, the wire metal material is formed directly (by ALD) on the seed layer. As particularly shown in FIGS. 22(a) and 22(b), the metal for the wire structures 112 is deposited directly upon the seed (spacer) layers 108 (including, for example, a maleic anhydride plasma polymer activated with dendritic amine), which are in turn formed upon the sidewalls of the mandrel 104. Then, as shown in FIGS. 23(a) and 23(b), the mandrel 104 and the covering nitride cap 106 are removed so as to define a pair of narrow conductive lines 112a, 112b on the substrate 102. Thereafter, a single selective liner ALD process is used to form corresponding liners 120a, 120b on the conductive wire structures 112a, 112b, as shown in FIGS. 24(a) and 24(b). As described in the first embodiment, amines or mixtures of oxygen with amines or ammonia may be used to activate the copper surface towards deposition of the metal nitride liner layer Through the implementation of one or more of the above described embodiments, the formation of conductive wire structures may be attained in a manner independent from conventional lithographic processes. Additionally, process simplicity is also provided as a result of eliminated extra deposition and etch processes. The uniformity of the wire is largely determined by the uniformity of the growth of the narrow metal material formed by atomic layer deposition, which does not suffer from the large through-pitch variations that are typically observed with conventional optical lithographic methods.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a conductive wire structure for a semiconductor device, the method comprising:
    defining a mandrel on a substrate;
    forming a seed layer on said mandrel;
    patterning said mandrel and removing at least a portion of said seed layer, thereafter forming a conductive wire material on said mandrel by atomic layer deposition; and
    forming a liner material around said conductive wire material by atomic layer deposition.

2. The method of claim 1, further comprising removing said mandrel prior to said forming said liner material around said conductive wire material.

3. The method of claim 1, further comprising forming a nitride cap on a top surface of said mandrel.

4. The method of claim 1, further comprising:
    forming a first portion of said liner material over said seed layer;
    forming said conductive wire material over said first portion of said liner material by atomic layer deposition; and
    forming a second portion of said liner material over said conductive wire material.

5. The method of claim 4, further comprising removing a portion of said mandrel following said forming said conductive wire material over said first portion of said liner material, prior to said forming said second portion of said liner material over said conductive wire material.

6. The method of claim 1, wherein said mandrel comprises one or more of: an oxide material, a siloxane material, a low-k dielectric material, an organic polymer, and a resist material.

7. The method of claim 6, wherein said seed layer comprises one or more of: a maleic anhydride polymer and a poly di-aminoethane plasma polymer.

8. The method of claim 1, wherein said conductive wire material further comprises at least one of: Cu, Pt, Ni and Ru.

9. The method of claim 8, wherein said liner material further comprises at least one of: TiN, TaN, WN, Ti, Ta and W.

10. A method for forming a conductive wire structure for a semiconductor device, the method comprising:
    defining a sacrificial structure on a substrate;
    forming a first liner layer on sidewalls of said sacrificial structure by atomic layer deposition;
    forming a conductive wire material on said first liner layer by atomic layer deposition;
    removing a portion of said sacrificial structure so as to expose a portion of said first liner layer; and
    forming a second liner layer over exposed portions of said conductive wire material.

11. The method of claim 10, wherein said first liner layer is formed on a seed layer formed on said sidewalls of said sacrificial structure.

12. The method of claim 10, further comprising forming a nitride cap on a top surface of said sacrificial structure.

13. The method of claim 10, wherein said sacrificial structure comprises one or more of: an oxide material, a siloxane material, a low-k dielectric material, an organic polymer, and a resist material.

14. The method of claim 13, wherein said seed layer comprises one or more of: a maleic anhydride polymer and a poly di-aminoethane plasma polymer.

15. The method of claim 10, wherein said conductive wire material further comprises at least one of: Cu, Pt, Ni and Ru.

16. The method of claim 15, wherein said first and second liner layers further comprise at least one of: TiN, TaN, WN, Ti, Ta and W.

17. A conductive wire structure for a semiconductor device, comprising:
- a mandrel formed on a substrate;
- a seed layer formed on said mandrel;
- a conductive wire material formed upon said mandrel by atomic layer deposition, said mandrel serving as a patterned structure for formation of said conductive wire material thereupon; and
- a liner material formed around said conductive wire material by atomic layer deposition, with a portion of said liner material formed on said seed layer.

* * * * *